US007067329B2

(12) United States Patent
Lee

(10) Patent No.: US 7,067,329 B2
(45) Date of Patent: Jun. 27, 2006

(54) METHODS OF FORMING FERROELECTRIC MEMORY DEVICES

(75) Inventor: Moon-Sook Lee, Seoul (KR)

(73) Assignee: Samsung Electronics Co., LTD, Kyungki-do (KR)

(*) Notice: Subject to any disclaimer, the term of this patent is extended or adjusted under 35 U.S.C. 154(b) by 429 days.

(21) Appl. No.: 10/273,115

(22) Filed: Oct. 17, 2002

(65) Prior Publication Data
US 2003/0077844 A1    Apr. 24, 2003

(30) Foreign Application Priority Data
Oct. 18, 2001    (KR) ............................... 2001-64252

(51) Int. Cl.
*H01L 21/00* (2006.01)
(52) U.S. Cl. ...................... 438/3; 438/694; 438/697; 438/702; 438/717; 438/720; 438/722
(58) Field of Classification Search ................ 438/3, 438/694, 697, 702, 717, 720, 722
See application file for complete search history.

(56) References Cited

U.S. PATENT DOCUMENTS

| | | | |
|---|---|---|---|
| 5,499,207 A | 3/1996 | Miki et al. | |
| 5,581,436 A | 12/1996 | Summerfelt et al. | |
| 6,043,526 A | 3/2000 | Ochiai | |
| 6,653,676 B1 * | 11/2003 | Tsu et al. | 257/296 |
| 6,723,648 B1 * | 4/2004 | Choi | 438/694 |

FOREIGN PATENT DOCUMENTS

JP    10-294441    4/1998
JP    2000-307079   11/2000

* cited by examiner

Primary Examiner—David Nelms
Assistant Examiner—Renee R. Berry
(74) Attorney, Agent, or Firm—Myers Bigel Sibley & Sajovec

(57) ABSTRACT

A ferroelectric memory device and a method of fabricating the same are provided. The device includes a substrate where a conductive region is formed and an interlayer insulating layer. The interlayer insulating layer is stacked on the substrate and has a contact hole exposing the conductive region. The contact hole is filled with a contact plug having a projection over the interlayer insulating layer. The projection of the contact plug is covered with a capacitor including a lower electrode, a ferroelectric layer pattern, and an upper electrode. A width of the projection is preferably greater than that of the contact hole and smaller than that of the lower electrode. The method includes forming lower and upper interlayer insulating layers on a substrate where a conductive region is formed. The lower and upper interlayer insulating layers have a contact hole exposing the conductive region. After forming a conductive contact plug filling the contact hole, the upper interlayer insulating layer is removed to expose the lower interlayer insulating layer. Thus, an upper portion of the contact plug that is higher than the lower interlayer insulating layer is projected. Continuously, a lower electrode, a ferroelectric layer pattern, and an upper electrode sequentially cover the projected contact plug to form a capacitor. The upper interlayer insulating layer is preferably made of a material having an etch selectivity with respect to the lower interlayer insulating layer. The contact hole is preferably formed such that a width of the contact hole formed in the upper interlayer insulating layer is greater than that of the contact hole formed in the lower interlayer insulating layer.

25 Claims, 4 Drawing Sheets

METHODS OF FORMING FERROELECTRIC MEMORY DEVICES

RELATED APPLICATION

This application relies for priority upon Korean Patent Application No. 2001-64252, filed on Oct. 18, 2001, the contents of which are herein incorporated by reference in their entirety.

FIELD OF THE INVENTION

The present invention relates to a ferroelectric random access memory (FRAM) and a method of fabricating the same. More specifically, the present invention is directed to a capacitor over bit line (COB) FRAM and a method of fabricating the same.

BACKGROUND OF THE INVENTION

A ferroelectric material exhibits polarization when an external electric field is applied, and maintains the polarization even after removing the external electric field. Also, the ferroelectric material is a material that may control a direction of spontaneous polarization with a change of the electric field. The ferroelectric material includes PZT[Pb(Zr, Ti)$O_3$], SBT[SrBi$_2$Ta$_2$O$_9$] and the like. The said characteristics of the ferroelectric material may be used to form binary memory devices. Therefore, extensive studies for applications of a ferroelectric random access memory (FRAM) have been progressed.

Generally, a FRAM device has a planar capacitor structure comprising planar upper and lower electrodes, and a ferroelectric thin layer between the electrodes. The upper and lower electrodes are made of noble metals such as iridium or platinum or their oxides. The ferroelectric thin layer is made of a ferroelectric material that is formed by a sol-gel method, sputtering, or chemical vapor deposition (CVD). However, as an integration level of a semiconductor memory device increases, a cell area of the FRAM device decreases. Hence, the capacitor area included in the cell is also becoming gradually reduced. Therefore, to ensure a sufficient capacitance, the capacitor structure needs to be three-dimensional so that the surface area of the capacitor may be increased. But, to form such a three-dimensional capacitor, additional steps should be taken in a conventional fabricating method. Since the additional steps may add significant cost in fabricating the semiconductor device, the number thereof is preferably minimized.

In a DRAM having a similar structure to a FRAM, a capacitor over bit line (COB) capacitor including both a storage node contact and a capacitor lower electrode may be employed. Unlike the DRAM, however, it is not preferable that both the storage node contact and the capacitor lower electrode belong to the FRAM capacitor with electrodes made of the noble metal. This is because an amount of the noble metal is preferably minimized to reduce the fabrication costs of the semiconductor device. In addition, some electrode materials are not preferable as the storage node contact due to a high electrical resistance or a poor gap fill characteristic.

In another approach, to increase the area of the lower electrode, a cylinder-type COB capacitor may be used. In this case, however, a node separation process of the lower electrode is not easily performed using chemical mechanical polishing (CMP). In addition, the cylinder is hardly formed when the lower electrode material suffers from degradation of a step coverage characteristic. For this reason, the cylinder-type COB capacitor also is not suitable for the FRAM device.

In addition, the capacitor of a stacked structure is also improper to the FRAM device. Forming of the capacitor of the stacked structure comprises stacking a thick lower electrode on the contact plug, then patterning the resultant structure where the lower electrode is stacked. In this method, since most of a high-priced material constituting the lower electrode layer is removed, the fabrication costs may be increased. Also, an etch process for forming the lower electrode is not easily performed.

FIG. 1 shows a method of fabricating a three-dimensional FRAM capacitor while minimizing the above-mentioned problems.

Referring to FIG. 1, a contact plug is formed as known to those skilled in the art. A lower interlayer insulating layer 12 is formed on a substrate 10. A lower contact plug 14 is formed to penetrate the lower interlayer insulating layer 12. An upper contact plug 18 is formed to be in contact with the lower contact plug 14. Forming the upper contact plug 18 comprises forming an upper interlayer insulating layer (not shown) on an entire surface of the semiconductor substrate where the lower contact plug 14 is formed. The upper interlayer insulating layer is then patterned to form an upper contact hole exposing the lower contact plug 14. The upper contact plug 18 is formed to fill the upper contact hole. Thereafter, the upper interlayer insulating layer is removed to expose both the upper contact plug 18 and the lower interlayer insulating layer 12.

Continuously, a lower electrode 22, a ferroelectric layer pattern 24, and an upper electrode 26 sequentially cover the exposed upper contact plug 18 to form a capacitor 20. In these steps, the upper contact plug 18 is exposed on the lower interlayer insulating layer 12, thereby forming the three-dimensional lower electrode 22. As a result, a capacitance of the capacitor may be increased. Examples of the foregoing conventional method are disclosed in U.S. Pat. No. 5,581,436, U.S. Pat. No. 5,499,207, and U.S. Pat. No. 6,043,526.

However, even in the conventional method, additional steps should be taken to make the structure of the upper contact plug three-dimensional. That is, the method should further comprise stacking, patterning, and removing the upper interlayer insulating layer. In addition, as the integration level of the semiconductor device increases, a margin of an exposure process is gradually reduced. Therefore, a likelihood of a misalignment is gradually increased while patterning the upper interlayer insulating layer. The misalignment may cause a decrease in a contact area between the upper and lower contact plugs.

SUMMARY OF THE INVENTION

The present invention is directed at providing a ferroelectric memory device including a three-dimensional capacitor.

The present invention also provides a method of fabricating a ferroelectric memory device with a three-dimensional capacitor that comprises minimum fabricating steps.

Furthermore, the present invention provides a method of fabricating a ferroelectric memory device that can minimize problems caused by misalignment.

According to the present invention, a method of fabricating a ferroelectric memory device comprises forming a contact plug to penetrate an interlayer insulating layer; recessing the interlayer insulating layer; and projecting an upper portion of the contact plug. The ferroelectric memory device includes a substrate where a conductive region is formed, and an interlayer insulating layer stacked on the substrate. The interlayer insulating layer includes a contact hole exposing the conductive region. The contact hole is filled with a contact plug having a projection over the interlayer insulating layer. The projection of the contact plug is covered with a capacitor including a lower electrode, a ferroelectric layer pattern, and an upper electrode. A width of the projection is greater than that of the contact hole.

A width of the lower electrode is greater than that of the projection of the contact plug. An etch stop layer is additionally disposed on the interlayer insulating layer. In this case, the etch stop layer is preferably one selected from the group consisting of a silicon nitride layer, a silicon nitride oxide layer, a titanium oxide layer, a titanium nitride layer, a double layer of a titanium nitride layer/a titanium layer, and a titanium aluminum nitride layer.

The method of fabricating a ferroelectric memory device comprises sequentially stacking lower and upper interlayer insulating layers on a substrate where a conductive region is formed. The upper and lower interlayer insulating layers are successively patterned to form a contact hole exposing the conductive region. A conductive contact plug is formed to fill the contact hole. The upper interlayer insulating layer is then removed to expose the lower interlayer insulating layer such that an upper portion of the contact plug is projected. At this time, the projected upper portion of the contact plug is higher than the lower interlayer insulating layer. Thereafter, a lower electrode, a ferroelectric layer pattern, and an upper electrode sequentially cover the projected upper portion of the contact plug to form a capacitor.

The contact hole is preferably formed such that a width of the contact hole formed in the upper interlayer insulating layer is greater than that of the contact hole formed in the lower interlayer insulating layer.

In addition, the upper interlayer insulating layer is preferably made of a material having an etch selectivity with respect to the lower interlayer insulating layer. Forming the contact hole comprises successively etching the upper and lower interlayer insulating layers using an anisotropic etch process to form the contact hole exposing the conductive region. A width of the contact hole is then increased. In the step of increasing the width of the contact hole, a sidewall of the contact hole is preferably etched using an isotropic etch process. The isotropic etch process employs an etch recipe in which an etch rate of the upper interlayer insulating layer is higher than that of the lower interlayer insulating layer.

It is preferable that an etch stop layer is additionally formed on the lower interlayer insulating layer before forming the upper interlayer insulating layer. The etch stop layer is formed to increase a margin of an etch process and ensure a reliable adhesion between the lower interlayer insulating layer and the lower electrode. In addition, another etch stop layer may be formed on the upper interlayer insulating layer.

Preferably, forming the capacitor comprises sequentially stacking a lower electrode layer, a ferroelectric layer, and an upper electrode layer on an entire surface of the resultant structure where the upper portion of the contact plug is projected. Then, the lower electrode layer, the ferroelectric layer, and the upper electrode layer are successively patterned.

Forming the capacitor preferably comprises forming the lower electrode layer on an entire surface of the resultant structure where the upper portion of the contact plug is projected. The lower electrode layer is patterned to form the lower electrode covering the projected upper portion of the contact plug. The ferroelectric layer and the upper electrode layer are sequentially stacked on an entire surface of the semiconductor substrate where the lower electrode is formed. Thereafter, the upper electrode layer and the ferroelectric layer are successively patterned to form the upper electrode and the ferroelectric layer pattern.

In the step of patterning the upper electrode layer and the ferroelectric layer, a single ferroelectric layer pattern and a single upper electrode that are sequentially stacked may cover at least two lower electrodes.

DESCRIPTION OF THE PREFERRED EMBODIMENT

The present invention will now be described more fully hereinafter with reference to the accompanying drawings, in which preferred embodiments of the invention are shown.

FIGS. 2 through 6 are cross-sectional views showing a method of fabricating a ferroelectric capacitor in accordance to a first preferred embodiment of the present invention.

Figure 1:
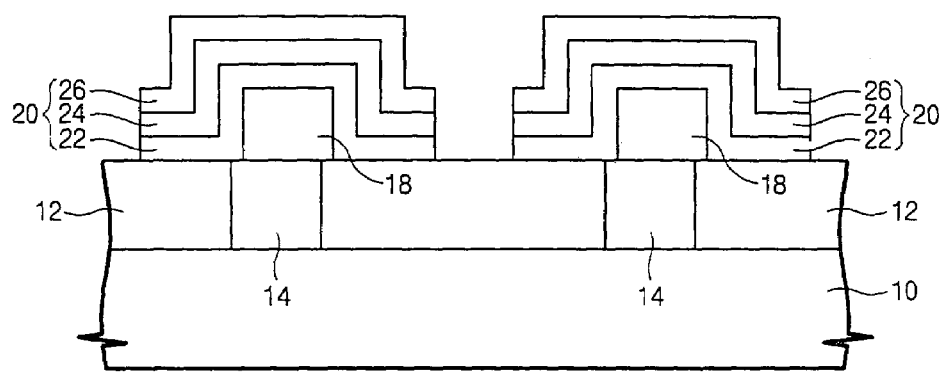
FIG. 1 is a cross-sectional view showing a conventional ferroelectric capacitor.
Figure 2:
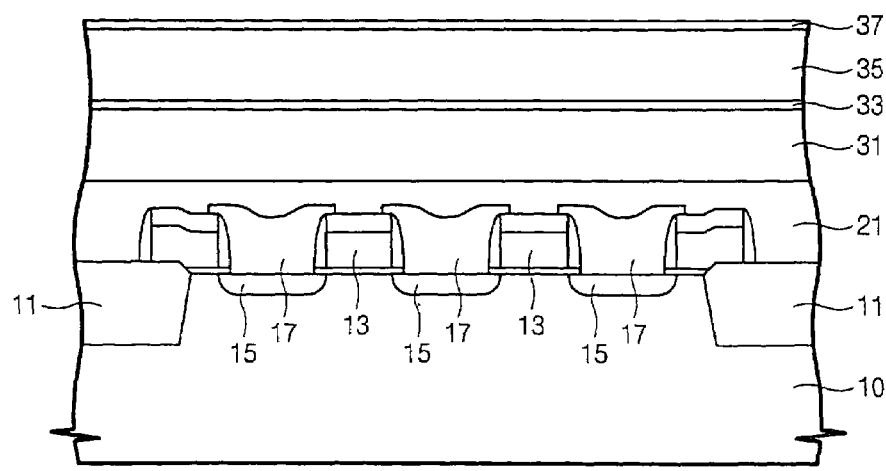
FIGS. 2 through 6 are cross-sectional views showing a method of fabricating a ferroelectric capacitor in accordance to a first preferred embodiment of the present invention.

Referring to FIG. 2, a device isolation layer 11 is formed to define an active region on a semiconductor substrate 10. After forming a gate insulating layer on the active region, a gate layer and a capping layer are sequentially formed on an entire surface of the substrate where the gate insulating layer is formed. The capping layer and the gate layer are successively patterned to form a gate electrode 13.

By using the gate electrode as an ion implantation mask, impurity ions are implanted to form a source/drain region 15 in an active region adjacent to the gate electrode 13. Continuously, a pad 17 is formed to be in contact with the source/drain region 15 as known to those skilled in the art. A first interlayer insulating layer 21 is formed on an entire surface of a semiconductor substrate having the pad 17, and patterned to form a bit line contact hole (not shown) exposing the pad 17 that is in contact with the drain 15. A conductive layer is formed to fill the bit line contact hole, and patterned to form a bit line contact plug (not shown) and a bit line (not shown). The bit line contact plug fills both the bit line contact hole and the bit line cross thereon. The bit line contact plug is electrically connected to the drain 15 through the pad 17.

Second and third interlayer insulating layers 21 and 35 are sequentially formed on the bit line and the first interlayer insulating layer 21. The second and third interlayer insulating layers 21 and 35 are made of materials having etch selectivities with respect to each other. It is preferable that first and second etch stop layers 33 and 37 are additionally formed on the second and third interlayer insulating layers 31 and 35. The first, second, and third interlayer insulating layers 21, 31, and 35 are preferably made of silicon oxide. At this time, the third interlayer insulating layer 35 is preferably made of a material whose etch rate is higher than that of the second interlayer insulating layer 31 during an etch process using a silicon oxide layer etch recipe. For example, the second interlayer insulating layer 31 may be made of high density plasma (HDP) oxide or tetra ethyl ortho silicate (TEOS). The third interlayer insulating layer 35 may be made of spin on glass (SOG) or bro-phospho-silicate-glass (BPSG).

Figure 3:
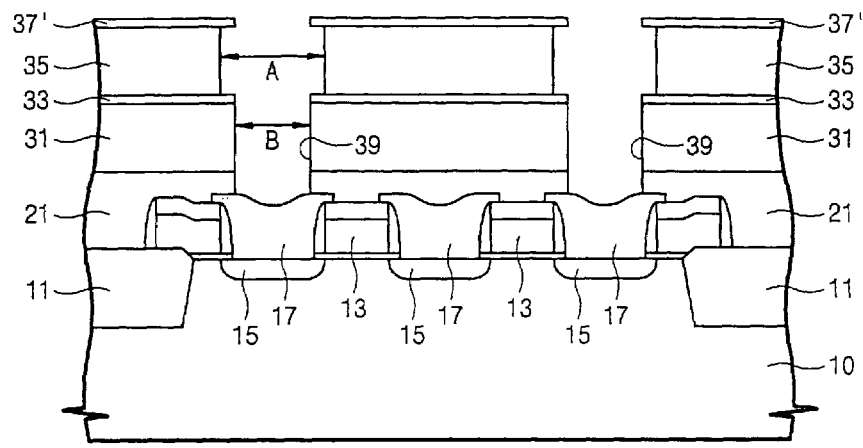

Referring to FIG. 3, the second etch stop layer 37, the third interlayer insulating layer 35, the first etch stop layer 33, the second interlayer insulating layer 31, and the first interlayer insulating layer 21 are successively patterned to form a contact hole of the capacitor lower electrode. The contact hole exposes the pad of the source region.

The patterning for forming the contact hole 39 may employ an anisotropic etch process, an isotropic etch process, or both. Preferably, the contact hole 39 is formed using the anisotropic etch process and a width of the contact hole 39 is increased using the isotropic etch process. In the isotropic etch process for increasing the width of the contact hole 39, it is preferable that an etch rate of the third interlayer insulating layer 35 is higher than that of the second interlayer insulating layer 31. The result is that a width A of the contact hole 39 formed on the third interlayer insulating layer 35 becomes greater than a width B of the contact hole 39 formed on the second interlayer insulating layer 31.

Meanwhile, the patterning for forming the contact hole 39 may employ a normal photoresist pattern (not shown) as an etch mask. Alternatively, the second etch stop layer 37 is patterned using the photoresist pattern as an etch mask to form a second etch stop layer pattern 37'. Thereafter, the second etch stop layer pattern 37' may be used as a hard mask for forming the contact hole 39. In case the second etch stop layer pattern 37' is used as the hard mask, the second etch stop layer pattern 37' is formed to have an opening whose width is smaller than that of the contact hole in the second interlayer insulating layer 31. The width of the opening is preferably adjusted in consideration of a thickness of the second interlayer insulating layer 31 that is recessed during the isotropic etch process.

Figure 4:
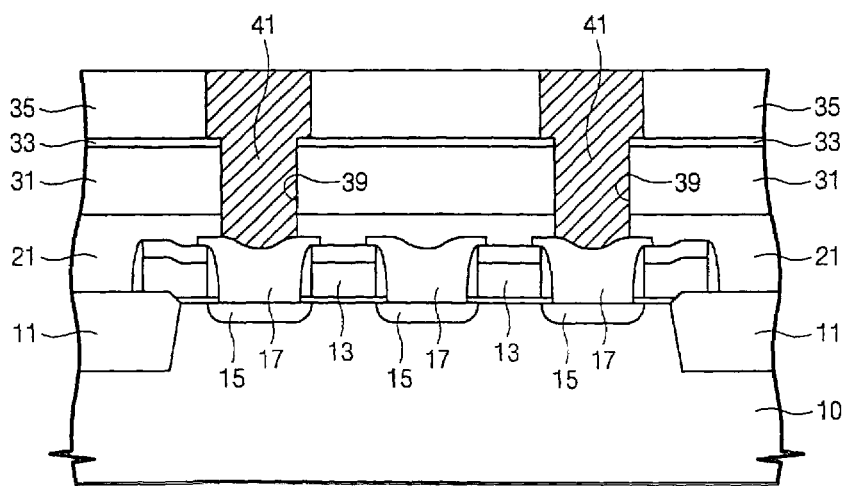

Referring to FIG. 4, the photoresist pattern and the second etch stop layer pattern 37' are removed to expose a top surface of the third interlayer insulating layer 35. A conductive layer (not shown) is then stacked to form a contact plug on an entire surface of the semiconductor substrate where the second etch stop layer pattern 37' is removed. Thereafter, the conductive layer is planarized until the top surface of the third interlayer insulating layer is exposed, thereby forming a contact plug 41 to fill the contact hole 39.

The conductive layer for forming the contact plug 41 may be formed by chemical vapor deposition (CVD), atomic layer deposition (ALD), or sputtering. The conductive layer is preferably made of one selected from the group consisting of tungsten, polysilicon, titanium nitride, titanium, titanium silicide, and cobalt silicide. According to a first embodiment of the present invention, a titanium nitride layer and a titanium layer are sequentially deposited using CVD or ALD, and then a remaining contact hole is filled with a tungsten layer. In this case, the titanium nitride layer and the titanium layer serve as barrier metals. Meanwhile, the second etch stop layer pattern 37' may be removed not before forming the conductive layer, but during each planarizing etch process.

Figure 5:
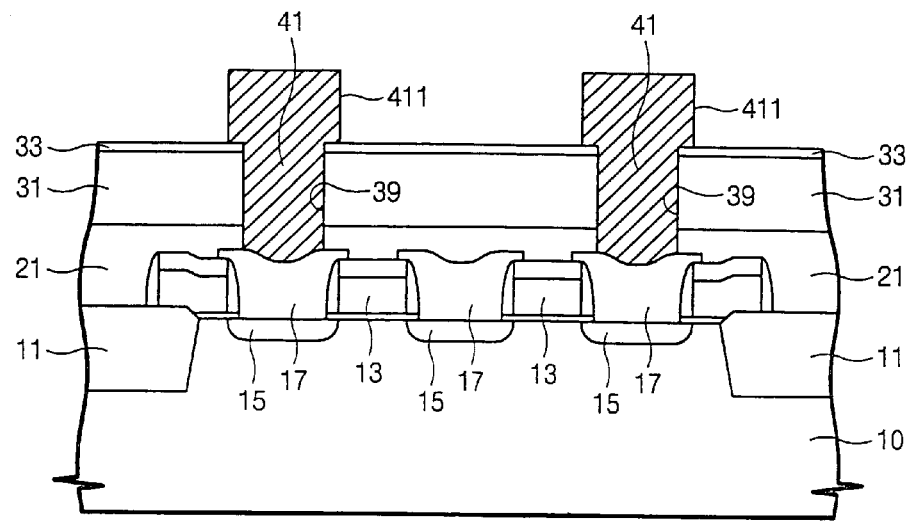

Referring FIG. 5, the exposed third interlayer insulating layer 35 is removed to expose the first etch stop layer 33. The third interlayer insulating layer 35 is removed using an etch recipe that has the etch selectivity with respect to both the contact plug 41 and the first etch stop layer 33. As a result, an upper portion (hereinafter referred to as "a projection (411)") of the contact plug 41 is projected over the first etch stop layer 33, whereas a lower portion of the contact plug 41 fills the contact hole 39 in the first and second interlayer insulating layers 21 and 31.

Preferably, the first etch stop layer 33 is made of a material having not only reliable adhesion to both the second interlayer insulating layer 31 and the contact plug 41, but also the etch selectivity with respect to the third interlayer insulating layer 35. The first etch stop layer 33 is preferably one selected from the group consisting of a silicon nitride layer, a silicon nitride oxide layer, a titanium oxide layer, a titanium nitride layer, a double layer of a titanium nitride layer/a titanium layer, and a titanium aluminum nitride layer. The reliable adhesion between the first etch stop layer 33 and the contact plug 41 can prevent the second interlayer insulating layer 31 from being etched during the etch process for removing the third interlayer insulating layer 35. In addition, the first etch stop layer 33 preferably has reliable adhesion also to a lower electrode that will be formed during a subsequent process. Meanwhile, the removed second etch stop layer 37 is also made of the same material as the first etch stop layer 33.

Figure 6:
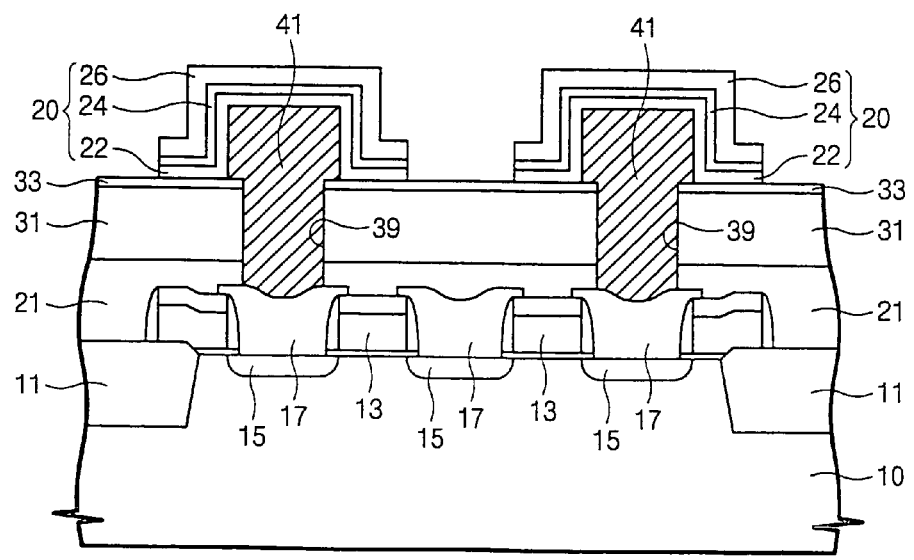

Referring to FIG. 6, a lower electrode layer, a ferroelectric layer, and an upper electrode layer are sequentially formed on an entire surface of the semiconductor substrate where the third interlayer insulating layer 35 is removed. Thereafter, the lower electrode layer, the ferroelectric layer, and the upper electrode layer are successively patterned to form a ferroelectric capacitor 20. The ferroelectric capacitor 20 is formed of a lower electrode 22, a ferroelectric pattern 24, and an upper electrode 26 that sequentially cover the projection 411.

The lower and upper electrode layers are preferably made of one selected from the group consisting of noble metals such as platinum, iridium, ruthenium, osmium, palladium, and rhodium, and their conductive oxides. The ferroelectric layer is preferably made of one selected from ferroelectric materials such as PZT[Pb(Zr,Ti)O$_3$], SrTiO$_3$, BaTiO$_3$, BST [(Ba,Sr)TiO$_3$], SBT(SrBi$_2$Ta$_2$O$_9$), (Pb,La)(Zr,Ti)O$_3$, and Bi$_4$Ti$_3$O$_{12}$. The ferroelectric material may be stacked by either sputtering or a sol-gel method and annealed in an oxidizing ambient of about 700° C. to form the ferroelectric layer. Alternatively, for forming the ferroelectric layer, the ferroelectric material may be stacked by CVD and annealed at 400 to 500° C.

Meanwhile, an adhesion layer (not shown) or an oxygen barrier layer (not shown) may be additionally stacked before forming the lower electrode layer. Preferably, the adhesion layer is one selected from the group consisting of a titanium layer, a double layer of a titanium nitride layer/a titanium layer, and a titanium aluminum nitride layer. The oxygen barrier layer is preferably made of iridium. The oxygen barrier layer is formed preferably when the lower electrode layer is made of platinum or the like that is not suitable for an oxygen barrier material.

Figure 7:
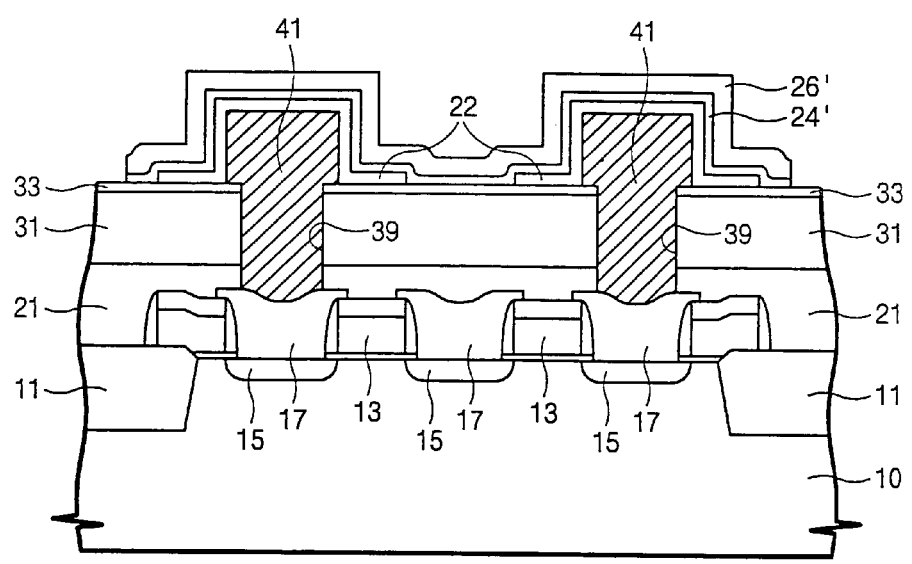
FIG. 7 is a cross-sectional view for explaining a method of fabricating a ferroelectric capacitor in accordance to another preferred embodiment of the present invention.

FIG. 7 is a cross-sectional view for explaining a method of fabricating a ferroelectric capacitor in accordance to another preferred embodiment of the present invention. The steps in FIGS. 2 through 5 are the same as those in the present embodiment. Description of those steps will be omitted here.

Referring to FIGS. 5 and 7, a lower electrode layer is formed on an entire surface of a semiconductor substrate where the third interlayer insulating layer 35 is removed. The lower electrode layer is patterned to form a lower electrode 22. A ferroelectric layer and an upper electrode layer are sequentially stacked on an entire surface of the semiconductor substrate having the lower electrode 22. The upper electrode layer and the ferroelectric layer are successively patterned to form a ferroelectric layer pattern 24' and an upper electrode 26' that cover the lower electrode 22. In the present embodiment, a single ferroelectric layer pattern 24' and a single upper electrode 26' that are sequentially stacked cover at least two lower electrodes 22.

An adhesion layer and an oxygen barrier layer may be additionally formed between the projection 411 and the lower electrode 22. Methods and materials of fabricating the ferroelectric layer, the upper and lower electrode layers are the same as methods and materials in accordance to the description of FIG. 6. In addition, the adhesion layer and the oxygen barrier layer are preferably formed according to the description of FIG. 6.

According to the present invention, a three-dimensional capacitor can be fabricated through minimum fabricating steps. As a result, a ferroelectric memory device with a sufficient capacitance can be economically fabricated.

Furthermore, problems caused by misalignment can be prevented, thereby fabricating a semiconductor device with a high reliability.

The invention claimed is:

1. A method of forming a ferroelectric memory device comprising:
   forming an insulating layer on a substrate;
   forming a sacrificial layer on the first insulating layer so that the insulating layer is between the sacrificial layer and the substrate;
   after forming the insulating layer and the sacrificial layer, forming a contact hole extending through the sacrificial layer and the insulating layer;
   after forming the contact hole, forming a conductive contact plug in the contact hole;
   after forming the conductive contact plug in the contact hole, removing the sacrificial layer so that the conductive contact plug extends beyond the insulating layer, and so that sidewalls of the conductive contact plug extending beyond the insulating layer are exposed;
   forming a first electrode on exposed portions of the conductive contact plug;
   forming a ferroelectric layer on the first electrode; and
   forming a second electrode on the ferroelectric layer such that the ferroelectric layer is between the first and second electrodes.

2. A method according to claim 1 wherein a width of a portion of the contact hole through the sacrificial layer is greater than a width of a portion of the contact hole through the insulating layer.

3. A method according to claim 2 wherein a width of portions of the conductive contact plug extending beyond the insulating layer is greater than a width of portions of the conductive contact plug extending through the insulating layer.

4. A method according to claim 1 wherein the insulating layer has a first etch rate with respect to a predetermined etchant, wherein the sacrificial layer has a second etch rate with respect to the predetermined etchant, and wherein the second etch rate is greater than the first etch rate.

5. A method according to claim 1 wherein forming the contact hole comprises:
   anisotropically etching the sacrificial layer and the insulating layer to provide a preliminary contact hole through the sacrificial layer and the insulating layer; and
   isotropically etching sidewalls of the preliminary contact hole wherein the isotropic etch provides a first etch rate with respect to the insulating layer and a second etch rate with respect to the sacrificial layer wherein the second etch rate is higher than the first etch rate so that a width of portions of the contact hole through the sacrificial layer is greater than a width of portions of the contact hole through the insulating layer.

6. A method according to claim 1 further comprising:
   before forming the sacrificial layer, forming an etch stop layer on the insulating layer wherein the etch stop layer resists an etch used to remove the sacrificial layer.

7. A method according to claim 1 further comprising:
   after forming the first electrode, the ferroelectric layer, and the second electrode, patterning the first electrode, the ferroelectric layer, and the second electrode are patterned using a single mask.

8. A method according to claim 1 further comprising:
   before forming the ferroelectric layer and the second electrode, patterning the first electrode wherein the ferroelectric layer and the second electrode extend across the first insulating layer beyond the first electrode.

9. A method according to claim 8 further comprising:
   forming a second contact hole extending through the sacrificial layer and the insulating layer; and
   before removing the sacrificial layer, forming a second conductive contact plug in the second contact hole; and
   after removing the sacrificial layer, forming a third electrode on exposed portions of the second conductive contact plug wherein the first and third electrodes are separate electrodes;
   wherein the ferroelectric layer extends from the first electrode to the third electrode.

10. A method of forming a ferroelectric memory device comprising:
    forming an insulating layer on a substrate:
    forming a contact hole extending through the insulating layer;
    forming a sacrificial layer on the insulating layer so that the insulating layer is between the sacrificial layer and the substrate;
    forming a contact hole extending through the sacrificial layer and the insulating layer;
    forming a conductive contact plug in the contact hole through the sacrificial layer and the insulating layer;
    after forming the conductive contact plug, removing the sacrificial layer so that the conductive contact plug extends beyond the insulating layer and so that sidewalls of the conductive contact plug extending beyond the insulating layer are exposed wherein a width of portions of the conductive contact plug extending beyond the insulating layer is greater than a width of portions of the conductive contact plug extending through the insulating layer;
    after removing the sacrificial layer, forming a first electrode on exposed portions of the conductive contact plug;
    forming a ferroelectric layer on the first electrode; and
    forming a second electrode on the ferroelectric layer such that the ferroelectric layer is between the first and second electrodes.

11. A method according to claim 10 wherein a width of a portion of the contact hole through the sacrificial layer is greater than a width of a portion of the contact hole through the insulating layer.

12. A method according to claim 10 wherein the layer has a first etch rate with respect to a predetermined etchant, wherein the sacrificial layer has a second etch rate with respect to the predetermined etchant, and wherein the second etch rate is greater than the first etch rate.

13. A method according to claim 10 wherein forming the contact hole comprises:
anisotropically etching the sacrificial layer and the insulating layer to provide a preliminary contact hole through the sacrificial layer and the insulating layer; and
isotropically etching sidewalls of the preliminary contact hole wherein the isotropic etch provides a first etch rate with respect to the insulating layer and a second etch rate with respect to the sacrificial layer wherein the second etch rate is higher than the first etch rate so that a width of portions of the contact hole through the sacrificial layer is greater than a width of portions of the contact hole through the insulating layer.

14. A method according to claim 10 further comprising:
before forming the sacrificial layer, forming an etch stop layer on the insulating layer wherein the etch stop layer resists an etch used to remove the sacrificial layer.

15. A method according to claim 10 further comprising:
after forming the first electrode, the ferroelectric layer, and the second electrode, patterning the first electrode, the ferroelectric layer, and the second electrode using a single mask.

16. A method according to claim 10 further comprising:
before forming the ferroelectric layer and the second electrode, patterning the first electrode wherein the ferroelectric layer and the second electrode extend across the first insulating layer beyond the first electrode.

17. A method according to claim 16 further comprising:
forming a second contact hole extending through the insulating layer; and
forming a second conductive contact plug in the second contact hole; and
forming a third electrode on exposed portions of the second conductive contact plug wherein the first and third electrodes are separate electrodes;
wherein the ferroelectric layer extends from the first electrode to the third electrode.

18. A method of fabricating a ferroelectric memory device comprising:
sequentially stacking lower and upper interlayer insulating layers on a substrate where a conductive region is formed;
successively patterning the upper and the lower interlayer insulating layers to form a contact hole exposing the conductive region;
forming a conductive contact plug filling the contact hole;
removing the upper interlayer insulating layer to expose the lower interlayer insulating layer such that an upper portion of the contact plug is projected, the projected upper portion of the contact plug is higher than the lower interlayer insulating layer; and
forming a capacitor including a lower electrode, a ferroelectric layer pattern, and an upper electrode that sequentially cover the upper portion of the projected contact plug.

19. The method as claimed in claim 18, wherein a width of the contact hole formed in the upper interlayer insulating layer is greater than that of the contact hole formed in the lower interlayer insulating layer.

20. The method as claimed in claim 18, wherein the upper interlayer insulating layer is made of a material having an etch selectivity with respect to the lower interlayer insulating layer.

21. The method as claimed in claim 18, wherein forming the contact hole comprises:
successively etching the upper and the lower interlayer insulating layer using an anisotropic etch process to form a contact hole exposing the conductive region; and
etching a sidewall of the contact hole using an isotropic etch process to increase a width of the contact hole,
wherein the isotropic etch process employs an etch recipe in which an etch rate of the upper interlayer insulating layer is higher than that of the lower interlayer insulating layer.

22. The method as claimed in claim 18, further comprising forming an etch stop layer on the lower interlayer insulating layer before forming the upper interlayer insulating layer.

23. The method as claimed in claim 18, wherein forming the capacitor comprises:
sequentially stacking a lower electrode layer, a ferroelectric layer, and an upper electrode layer on an entire surface of the resultant structure where the upper portion of the contact plug is projected; and
successively patterning the upper electrode layer, the ferroelectric layer and the lower electrode layer.

24. The method as claimed in claim 18, wherein forming the capacitor comprises:
forming a lower electrode layer on an entire surface of the resultant structure where the upper portion of the contact plug is projected;
patterning the lower electrode layer to form the lower electrode covering the projected upper portion of the contact plug;
sequentially stacking a ferroelectric layer and an upper electrode layer on an entire surface of a semiconductor substrate where the lower electrode is formed; and
successively patterning the upper electrode layer and the ferroelectric layer to form an upper electrode and a ferroelectric layer pattern.

25. The method as claimed in claim 24, wherein patterning the upper electrode layer and the ferroelectric layer is performed such that a single ferroelectric layer pattern and a single upper electrode that are sequentially stacked cover at least two lower electrodes.

* * * * *